(12) United States Patent
Tsai et al.

(10) Patent No.: US 8,324,908 B2
(45) Date of Patent: Dec. 4, 2012

(54) ELECTRICAL CONNECTION DEFECT DETECTION DEVICE

(75) Inventors: Su-Wei Tsai, Taipei (TW); Shang-Tsang Yeh, Jhonghe (TW)

(73) Assignee: Test Research, Inc., Taipei (TW)

( * ) Notice: Subject to any disclaimer, the term of this patent is extended or adjusted under 35 U.S.C. 154(b) by 327 days.

(21) Appl. No.: 12/761,481

(22) Filed: Apr. 16, 2010

(65) Prior Publication Data

US 2011/0156718 A1    Jun. 30, 2011

(30) Foreign Application Priority Data

Dec. 31, 2009  (TW) ............................. 98146543 A

(51) Int. Cl.
*G01R 31/04* (2006.01)
(52) U.S. Cl. ...................................................... 324/538
(58) Field of Classification Search ................. 324/538, 324/658, 686, 688, 690
See application file for complete search history.

(56) References Cited

U.S. PATENT DOCUMENTS

| | | | | |
|---|---|---|---|---|
| 5,124,660 A * | 6/1992 | Cilingiroglu | ................. | 324/538 |
| 5,420,500 A * | 5/1995 | Kerschner | ..................... | 324/72.5 |
| 5,498,964 A * | 3/1996 | Kerschner et al. | ............ | 324/530 |
| 7,307,427 B2 * | 12/2007 | Jacobsen et al. | ............... | 324/519 |
| 2006/0076960 A1 * | 4/2006 | Tesdahl et al. | ................ | 324/519 |

* cited by examiner

*Primary Examiner* — Paresh Patel
(74) *Attorney, Agent, or Firm* — Muncy, Geissler, Olds & Lowe, PLLC

(57) ABSTRACT

An electrical connection defect detection device to detect whether an electrical connection between an under-test pin of an under-test device and a signal line of a circuit board is normal is provided. The electrical connection defect detection device comprises a signal provider providing a test signal to the under-test pin through the signal line, a detection module and an electrode board comprising a detection surface and at least one array of through holes. The detection surface contacts a surface of the under-test device to make the detection module detect a capacitance value associated with the electrode board, the under-test pin and the signal line larger than a threshold value when their connection is normal. The through holes are placed along the edges of the electronic board and are electrically connected to a ground potential to perform a capacitive shielding.

14 Claims, 2 Drawing Sheets

ELECTRICAL CONNECTION DEFECT DETECTION DEVICE

RELATED APPLICATIONS

This application claims priority to Taiwan Application Serial Number 98146543, filed Dec. 31, 2009, which is herein incorporated by reference.

BACKGROUND

1. Technical Field

The present disclosure relates to a detection device. More particularly, the present disclosure relates to an electrical connection defect detection device.

2. Description of Related Art

Modern technology, especially the use of electronic devices, brings convenience to our daily life. Often, the electronic devices include many different chips or connectors formed thereon to deal with or transmit different types of data. The pins of the chips and the connectors are connected to the signal lines of the circuit boards of the electronic devices to perform data exchange at the request of the user.

However, the electrical connection of the pins and the signal lines may not be properly connected due to the unsuccessful welding process. When the pins and the signal lines are not properly connected to each other, the electronic device may fail to perform normal operation. Therefore, an electrical connection defect detection device is needed to detect whether there is a defect between the pins and the corresponding signal lines. Usually, a probe is used to contact a signal line corresponding to an under-test pin of an under-test object and to further send a test signal to the under-test pin through the signal line. An electrode board connected to a detection module is placed on a surface of the under-test object to determine whether a capacitance associated with the electrode board and the under-test pin is detected. In the conventional test procedure, the test points are mainly on a side of the circuit board that is opposite to the side where the electrode board is placed, i.e. the probe tests the signal lines that are placed on the side of the circuit board that is opposite to the side where the electrode board is placed. Therefore, the probe contacting the signal lines keeps a distance from the electrode board. However, in modern technology, the test points can be on the same side of the circuit board as the side where the electrode board is placed, i.e. the probe tests the signal lines that are placed on the same side of the circuit board as the side where the electrode board is placed during the test procedure. Thus, the probe is placed much nearer to the electrode board under such a condition. An undesired capacitance may be generated due to the close distance of the probe and the electrode board and may thus affect the test result.

Accordingly, what is needed is an electrical connection defect detection device to avoid the undesired capacitance generated as described above. The present disclosure addresses such a need.

SUMMARY

An aspect of the present disclosure is to provide an electrical connection defect detection device to detect whether an electrical connection between an under-test pin of an under-test device and a signal line of a circuit board is normal, wherein the electrical connection defect detection device comprises a signal provider, a detection module and an electrode board. The signal provider provides a test signal to the under-test pin through the signal line. The electrode board is electrically connected to the detection module, wherein the electrode board comprises a detection surface and at least one array of through holes. The detection surface contacts a surface of the under-test device and keeps a distance from the under-test pin such that the detection module detects a value of a capacitance associated with the electrode board, the under-test pin and the signal line larger than a threshold value when the signal provider provides the test signal to the under-test pin and when the connection of the under-test pin and the signal line is normal. The array of through holes are placed along the edges of the electrode board and electrically connected to a ground potential to perform a capacitive shielding when the signal provider and the electrode board are on the same side of the circuit board.

Another aspect of the present disclosure is to provide an electrical connection defect detection device to detect whether an electrical connection between an under-test pin of an under-test device and a signal line of a circuit board is normal, wherein the electrical connection defect detection device comprises a signal provider, a detection module and an electrode board. The signal provider provides a test signal to the under-test pin through the signal line. The electrode board is electrically connected to the detection module, wherein the electrode board comprises a detection surface and an electromagnetic shielding object. The detection surface contacts a surface of the under-test device and keeps a distance from the under-test pin such that the detection module detects a value of a capacitance associated with the electrode board, the under-test pin and the signal line larger than a threshold value when the signal provider provides the test signal to the under-test pin and when the connection of the under-test pin and the signal line is normal. The electromagnetic shielding object surrounds the edges of the electrode board and is electrically connected to a ground potential to perform a capacitive shielding when the signal provider and the electrode board are on the same side of the circuit board.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
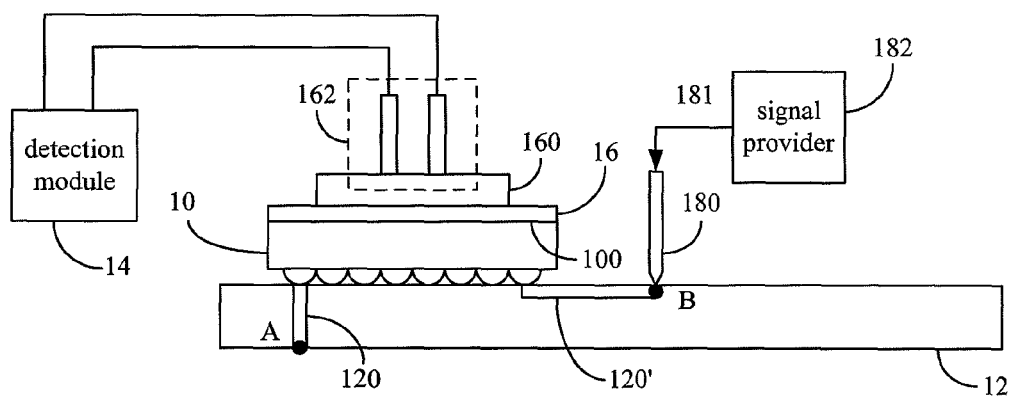
FIG. 1 is a side view of an electrical connection defect detection device of an embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Please refer to FIG. 1. FIG. 1 is a side view of an electrical connection defect detection device 1 of an embodiment of the present disclosure. The electrical connection defect detection device 1 is for detecting whether an electrical connection between an under-test pin of an under-test device 10 and signal lines of a circuit board 12 is normal. The under-test device 10 in the present embodiment is a chip on the circuit board 12 and is connected to the signal lines of a circuit board 12 through a plurality of pins (depicted as a plurality of semicircle shaped objects placed between the under-test device 10 and the circuit board 12 in FIG. 1). It's noticed that though only two signal lines 120 and 120' are shown in FIG. 1, there are substantially other signal lines corresponding to other pins that is not shown.

A welding process is performed on the pins and the signal lines to make the under-test device 10 and the circuit board 12 electrically connected. However, the electric connection of the pins and the signal lines may not be properly connected due to the unsuccessful welding process. Therefore, an electrical connection defect detection device is needed to detect whether there is a connection defect between the pins and the corresponding signal lines.

The electrical connection defect detection device 1 of the present embodiment comprises a signal provider, a detection module 14 and an electrode board 16. The signal provider substantially comprises a probe 180 and a signal source 182. The signal source 182 provides a test signal 181. After the probe 180 contacts the signal line 120 or 120', the signal source 182 transmits the test signal 181 through the signal line 120 or 120' to the corresponding under-test pin. During the test procedure, the pins not under test are all grounded to avoid undesirable effects.

The electrode board 16 is electrically connected to the detection module 14. In an embodiment, the electrode board 16 comprises an amplifier 160 and positive/negative test ends 162. A detection surface of the electrode board 16 directly contacts a surface 100 of the under-test device 10 opposite to the surface where the pins are placed. Therefore, the detection surface of the electrode board 16 keeps a distance from the under-test pin. In an embodiment, the positive/negative test ends 162 provide a supply voltage and a ground potential GND (shown in FIG. 2) to the electrode board 16 through the positive end and the negative end respectively. Generally speaking, the supply voltage is transmitted to the amplifier 160. The ground potential is transmitted to the surface opposite to the detection surface. However, in other embodiments, other possible arrangements can be made depending on different conditions.

The electrode board 16 is able to detect a capacitance related to the under-test pin, the circuit board 12 and the electrode board 16 when the electrical connection between the signal line and the corresponding under-test pin is normal. The electrode board 16 is also able to detect a current and a voltage associated with the capacitance described above. The capacitance is generated because of the test signal 181 sent from the probe 180 to the under-test pin and is detected by the positive/negative test end 162. After the detection of the positive/negative test end 162, a signal associated with the capacitance is amplified by the amplifier 160 and is sent to the detection module 14. The detection module 14 is able to determine whether the value of the capacitance is larger than a threshold value. When the value of the capacitance is larger than the threshold value, the detection module 14 determines that the electrical connection is normal. On the other hand, when the electrical connection is abnormal, the test signal 181 fails to be transmitted from the signal line to the corresponding under-test pin. Though the capacitance between the under-test device 10 and the electrode board 16 doesn't change, the capacitance between the circuit board 12 and the electrode board 16 decreases a lot due to the abnormal connection between the signal lines and the under-test pin. As a result, the detection module 14 determines that the total capacitance is below the threshold value. The current and the voltage associated with the capacitance decrease as well. Therefore, the defect detection mechanism can be made.

During the test procedure, the probe 180 contacts different places of the circuit board 12 according to the places where the pins locate. For a conventional circuit board design, the signal lines are placed on the side of the circuit board 12 that is opposite to the side where the electrode board 16 is placed, such as the point A labeled on the signal line 120 depicted in FIG. 1. Therefore, the probe 180 contacting the point A of the signal line 120 keeps a distance from the electrode board 16 and further sends the test signal 181 to the under-test pin. However, in modern technology, some signal lines are placed on the same side of the circuit board 12 as the side where the electrode board 16 is placed, such as the point B labeled on the signal line 120' depicted in FIG. 1. Thus, the probe 180 contacting the point B is placed much nearer to the electrode board 16 under such a condition. An undesired capacitance may be generated due to the close distance of the probe 180 and the electrode board 16 and may thus affect the test result. If the electrical connection of the under-test pin and the signal line 120' is abnormal, the additional capacitance is able to make the value of the total capacitance detected increase and become larger than the threshold value. Consequently, though the electrical connection is abnormal, the detection module 14 determines that the under-test pin passes the test.

Figure 2:
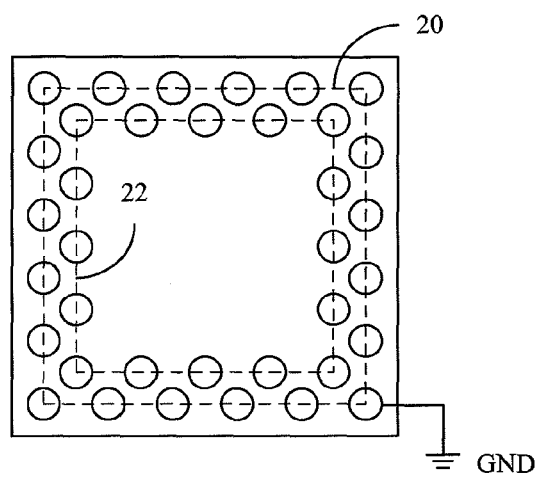
FIG. 2 is a top view of the electrode board of an embodiment of the present disclosure.

Please refer to FIG. 2. FIG. 2 is a top view of the electrode board 16 of an embodiment of the present disclosure. The electrode board 16 comprises two array of through holes 20 and 22. The two arrays of through holes 20 and 22 are placed along the edges of the electrode board 16 and are interlaced with each other. Each through hole passes through the electrode board 16 and is connected to a ground potential GND as shown in FIG. 2. Therefore, the two arrays of through holes 20 and 22 are able to perform a capacitive shielding when the probe 180 of the signal provider and the electrode board 16 are on the same side of the circuit board 12. In an embodiment, the two arrays of the through holes 20 and 22 are connected to the ground potential of the negative side of the positive/negative test ends 162.

It's noticed that, there can be only one array of through holes placed on the electrode board 16. However, there are lots of gaps between each pair of through holes. The gaps result in worse capacitive shielding effect. Therefore, the interlace arrangement of two arrays of through holes provides a better shielding effect. Substantially, the number of the arrays of the through holes, the number of through holes of each array and the size of each through hole can be different in other embodiments depending on different situations.

Figure 3:
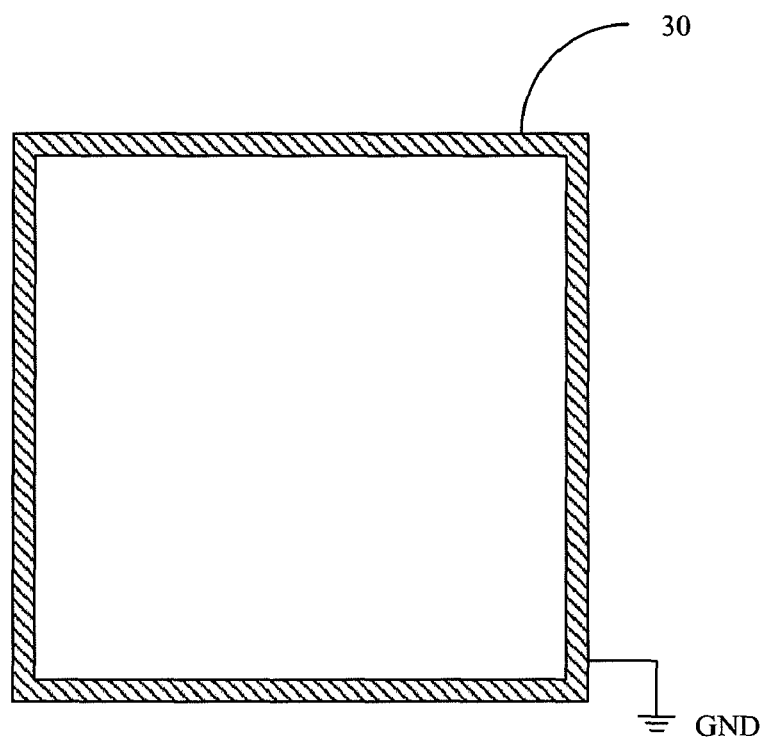
FIG. 3 is a top view of the electrode board of another embodiment of the present disclosure.

Please refer to FIG. 3. FIG. 3 is a top view of the electrode board 16 of another embodiment of the present disclosure. In the present embodiment, the electrode board 16 comprises an electromagnetic shielding object 30 surrounding the edges the electrode board and is electrically connected to a ground potential GND as shown in FIG. 3 to perform a capacitive shielding. In an embodiment, the electromagnetic shielding object is a metal shielding, such as solder, copper or gold to be formed on the edges of the electrode board 16 through a solder leveling process or a sputtering process. In yet another embodiment, the electromagnetic shielding object 30 is a conductive fabric or a conductive tape winding around the edges of the electrode board 16. Similarly, the electromagnetic shielding object 30 can be connected to the ground potential of the negative side of the positive/negative test ends 162.

If the metal shielding is used on the electrode board 16, an additional forming process is needed. However, the conductive fabric or the conductive tape doesn't need such a forming process. Consequently, the conductive fabric or the conductive tape costs less than the metal shielding, which is more desirable.

The present disclosure provides a capacitive shielding mechanism by placing the through holes or the electromagnetic shielding object on the electrode board to avoid the capacitive effect that leads to inaccurate test result.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. An electrical connection defect detection device to detect whether an electrical connection between an under-test pin of an under-test device and a signal line of a circuit board is normal, wherein the electrical connection defect detection device comprises:
a signal provider to provide a test signal to the under-test pin through the signal line;
a detection module; and
an electrode board electrically connected to the detection module, wherein the electrode board comprises:
a detection surface to contact a surface of the under-test device and keep a distance from the under-test pin such that the detection module detect a value of a capacitance associated with the electrode board, the under-test pin and the signal line larger than a threshold value when the signal provider provides the test signal to the under-test pin and when the connection of the under-test pin and the signal line is normal; and
at least one array of through holes placed along the edges of the electrode board and electrically connected to a ground potential to perform a capacitive shielding when the signal provider and the electrode board are on the same side of the circuit board.

2. The electrical connection defect detection device of claim 1, wherein the signal provider comprises a probe and a signal source, wherein the probe contacts the signal line to make the signal source provide the test signal to the under-test pin.

3. The electrical connection defect detection device of claim 1, when the signal provider provides the test signal to the under-test pin and when the connection of the under-test pin and the signal line is abnormal, the detection module detects the value of the capacitance smaller than the threshold value.

4. The electrical connection defect detection device of claim 1, the detection module further detects a current generated by the capacitance.

5. The electrical connection defect detection device of claim 1, the detection module further detects a voltage generated by the capacitance.

6. The electrical connection defect detection device of claim 1, wherein the electrode board substantially comprises two arrays of through holes placed along the edges of the electrode board and interlaced with each other.

7. An electrical connection defect detection device to detect whether an electrical connection between an under-test pin of an under-test device and a signal line of a circuit board is normal, wherein the electrical connection defect detection device comprises:
a signal provider to provide a test signal to the under-test pin through the signal line;
a detection module; and
an electrode board electrically connected to the detection module, wherein the electrode board comprises:
a detection surface to contact a surface of the under-test device and keep a distance from the under-test pin such that the detection module detect a value of a capacitance associated with the electrode board, the under-test pin and the signal line larger than a threshold value when the signal provider provides the test signal to the under-test pin and when the connection of the under-test pin and the signal line is normal; and
an electromagnetic shielding object surrounding edges of the electrode board and electrically connected to a ground potential to perform a capacitive shielding when the signal provider and the electrode board are on the same side of the circuit board.

8. The electrical connection defect detection device of claim 7, wherein the signal provider comprises a probe and a signal source, wherein the probe contacts the signal line to make the signal source provide the test signal to the under-test pin.

9. The electrical connection defect detection device of claim 7, when the signal provider provides the test signal to the under-test pin and when the connection of the under-test pin and the signal line is abnormal, the detection module detects the value of the capacitance smaller than the threshold value.

10. The electrical connection defect detection device of claim 7, wherein the electromagnetic shielding object is a metal shielding.

11. The electrical connection defect detection device of claim 10, wherein the metal is solder, copper or gold to be formed on the edges of the electrode board through a solder leveling process or a sputtering process.

12. The electrical connection defect detection device of claim 7, wherein the electromagnetic shielding object is a conductive fabric or a conductive tape.

13. The electrical connection defect detection device of claim 7, the detection module further detects a current generated by the capacitance.

14. The electrical connection defect detection device of claim 7, the detection module further detects a voltage generated by the capacitance.

* * * * *